United States Patent [19]

Allen

[11] Patent Number: 5,135,889
[45] Date of Patent: Aug. 4, 1992

[54] METHOD FOR FORMING A SHIELDING STRUCTURE FOR DECOUPLING SIGNAL TRACES IN A SEMICONDUCTOR

[75] Inventor: David H. Allen, Boise, Id.
[73] Assignee: Micron Technology, Inc., Boise, Id.
[21] Appl. No.: 805,874
[22] Filed: Dec. 9, 1991
[51] Int. Cl.⁵ .......................................... H01L 21/283
[52] U.S. Cl. ...................................... 437/195; 437/50; 437/60
[58] Field of Search ................... 437/195, 52, 60, 919, 437/50; 307/296.8; 365/53; 357/53

[56] References Cited

U.S. PATENT DOCUMENTS

| | | | |
|---|---|---|---|
| 4,177,488 | 12/1979 | Sakai | 360/72.3 |
| 4,714,981 | 12/1987 | Gordon | 361/400 |
| 4,716,549 | 12/1987 | Nakano et al. | 365/203 |
| 4,879,631 | 11/1989 | Johnson et al. | 361/386 |
| 4,962,476 | 10/1990 | Kawada | 365/53 |
| 4,994,688 | 2/1991 | Horiguchi | 307/296.8 |

Primary Examiner—T. N. Quach
Attorney, Agent, or Firm—Nydegger & Associates

[57] ABSTRACT

A method for forming a semiconductor structure including parallel spaced conducting traces each physically separated by a grounding trace. The grounding traces are located in between the conducting traces to provide a shielding structure to diminish capacitive coupling between the conducting traces. At the same time, each conducting traces is capacitively coupled to each adjacent pair of grounding traces and the grounding traces are connected to a ground such as a grounded substrate. The grounding traces are formed on a different layer of the semiconductor structure from the conducting traces such that a layout area of the conducting traces is not affected.

13 Claims, 2 Drawing Sheets

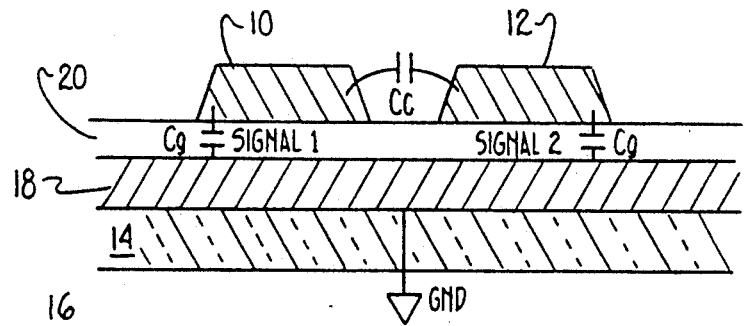
Fig. 2A (PRIOR ART)
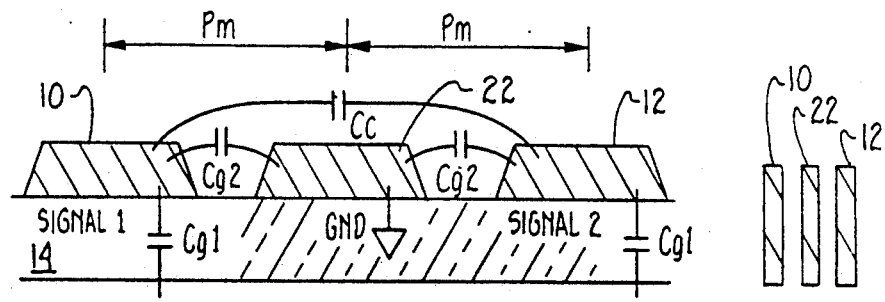
Fig. 2B (PRIOR ART)
Fig. 2C (PRIOR ART)
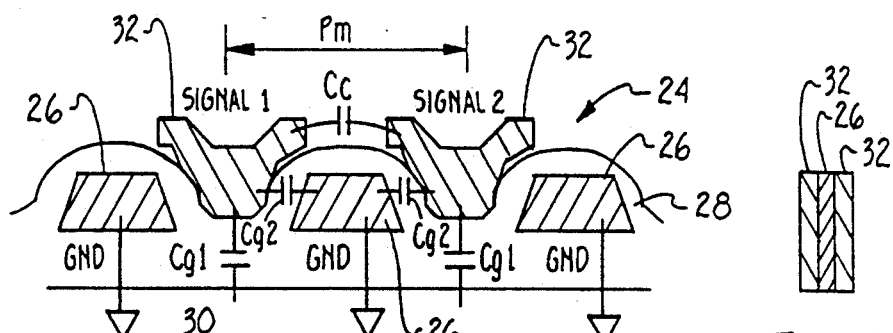
Fig. 3A
Fig. 3B

METHOD FOR FORMING A SHIELDING STRUCTURE FOR DECOUPLING SIGNAL TRACES IN A SEMICONDUCTOR

TECHNICAL FIELD

This invention relates to integrated circuits and more particularly, to a method for forming a shielding structure for a semiconductor having adjacent signal traces for decoupling the signal traces.

BACKGROUND OF THE INVENTION

Microchip fabrication involves the formation of integrated circuits (ICs) on a semiconducting substrate. A large number of semiconductor devices or ICs are typically constructed on a single substrate or wafer of a single crystal silicon material. The area on the wafer occupied by the discrete devices or ICs is called a chip or die. After formation, the individual chips are separated and connected by gold wires to a lead frame. Typically the chips are then packaged in a plastic or ceramic package that is necessary to protect the chip and provide a substantial electrical lead system. For forming electronic devices a number of chips are electrically connected on printed circuit boards by techniques such as socketing or soldering.

Within an individual chip a large number of discrete individual electrical devices are formed. These separate devices are interconnected using conductive metal lines or traces formed by patterning metal layers deposited onto the substrate. Signals, such as pulsating DC signals and AC signals, are routed over the metal traces to the devices. Most commonly, the signals are routed in aluminum metal, which provides the lowest resistivity of the thin films available in integrated circuit manufacture. Often several conductive traces are routed adjacent to each other in an area expressly allocated for signal routing (bussing). These traces can run parallel to one another for several millimeters.

Signal traces are driven by transistors which switch the voltage levels very rapidly. The close proximity of other structure (such as signal traces) and other layers (such as substrate) results in capacitive coupling to the signal traces. Switching of the voltage level of a signal trace can result in a corresponding inadvertent change in a voltage level on a nearby signal trace or layer, resulting in logic errors.

As an example, an alternating current signal, such as a clock signal, or a pulsating direct current, will be capacitively coupled into the substrate. This capacitive coupling will result in unwanted noise in the substrate. This noise will likely be carried by the substrate into nearby circuitry and may cause circuit malfunctions such as mistriggering.

U.S. patent application Ser. No. 683,767 to Hesson et al., entitled Low-Noise, Area-Efficient, High-Frequency Clock Signal Distribution Line Structure, and assigned to the assignee of the present application, discloses a transmission line structure for decoupling high-frequency signals carried by a signal line from a subjacent substrate. This application is largely concerned with clock lines which cover a large physical area on an IC and therefore couple proportionately to the substrate.

Another type of capacitive coupling can occur between adjacent conductive traces. This type of capacitive coupling though on a smaller area scale is comparable to the coupling between a conductive trace and the substrate or ground plane and can produce similar logic errors. FIG. 1A illustrates such a situation.

With reference to FIG. 1A a semiconductor structure includes conductive traces 10, 12 in the form of two parallel metal lines formed on an oxide layer 14 above a grounded substrate 16. Conductive trace 10 carries a signal 1 and conductive trace 12 carries a signal 2 to semiconductor devices (not shown). The conductive traces 10, 12 are spaced (center to center) a distance equal to the metal pitch (Pm) attainable by the particular fabrication technology. In state of the art technologies, such as VLSI and ULSI, the metal pitch (Pm) is comparable to the vertical separation from the conductive traces 10 12 to the substrate 16. Likewise, the capacitance (Cc) between the conductive traces 10, 12 is comparable to the capacitance (Cg) from the conductive traces 10, 12 to the substrate 16.

The electrical schematic shown in FIG. 1B represents an electrical model of the two unshielded parallel conductive traces 10, 12 (i.e. the structure shown in FIG. 1A). FIG. 1C illustrates the affect when conductive trace 10 or 12 experiences a rapid change in potential (i.e. in switching from one logic level to another). Since a finite impedance (Rd) exists between the point of coupling of Signal 1 and the driver of Signal 2, the response of Signal 2 will be to shift with Signal 1 until the driver can restore the original voltage level. The magnitude of the noise "bump" at Signal 2 is proportional to the ratio of Cc and Cg. A larger Cc/Cg ratio results in more cross coupling between the conductive traces 10 or 12. If Signal 2 is a direct action signal such as a reset or clock line, a spurious transition due to cross coupling between the conductive traces 10 or 12 can result in circuit failure.

Note that there are at least four cases of interest regarding the voltage levels present on conductive trace 10 and conductive trace 12: 1) one signal low and the other transitioning between a low level and a high level; 2) one signal high and the other transitioning from a high level to a low level; 3) one signal high and the other transitioning from a low level to a high level: 4) one signal low and the other transitioning from a high level to a low level.

Generally, only cases 1 and 2 above will cause logic errors due to spurious transitions, but cases 3 and 4 are of concern also in that the "static" signal can be boosted above the power supply voltage (case 3) or below ground (case 4), resulting in charge injection through diffusions into the substrate or well. Such injections can cause loss of data at dynamic storage nodes (i.e. DRAM cells) or, at worst, latchup.

With reference to FIG. 2A, one prior art method used to reduce cross-coupling between adjacent conductive traces on a semiconductor substrate is to move the ground plane nearer the conductive traces 10, 12. This could be accomplished, for example, by placing a conductive material such as a layer of polysilicon 18 beneath the conductive traces 10, 12 and tying the polysilicon 18 to the grounded substrate 16. In this case the capacitance coupling to ground Cg is increased, since the physical separation from the conductive traces 10, 12 to ground has decreased. Similarly, a cross coupling (Cc) between the conductive traces 10, 12 is reduced and the ratio of Cg/Cc increases. This helps only marginally, however, since the reduction in separation between the conductive traces and substrate is dependant upon the relative thicknesses of the dielectric or oxide 14 between the conductive traces 10, 12 and substrate 16 and the dielectric 20 between the polysilicon 18 and the conductive traces 10, 12. As is apparent, on a vertical level, these distances will not be large. In addition the polysilicon 18 shielding layer is not physically located between the conductive traces 10, 12, but rather is orthogonal to the coupling direction from the conductive traces 10, 12 to the substrate 16. Accordingly the direct effect on cross coupling between the conductive traces 10, 12 is minimal.

With reference to FIGS. 2B and 2C, a second prior art approach taken to reduce cross coupling between conductive traces 10, 12 is to introduce another metal line or a shielding trace 22 between the conductive traces 10, 12. The capacitance to ground (Cg) for either trace 10, 12 is now the sum of the capacitance to substrate (Cg1) and the capacitance (Cg2) to the shielding trace 22. The magnitude of the noise on metal line 12 as a result of a transition on metal line 10 is proportional to the ratio of Cc to Cg (the sum of Cg1 and Cg2). The net effect of adding a grounded metal line as a shielding trace 22 is: 1) increased separation between conductive traces 10,12 leading to a lower Cc, but at a cost of more area; 2) increased signal capacitance to ground, thereby reducing the ratio of cross coupling to ground capacitance (i.e. Cc/Cg). While this technique works very well in reducing cross coupling between the conductive traces 10,12, the penalty is severe in that the layout area required to pattern the conductive traces 10,12 is doubled (i.e. line to line spacing is now 2XPm).

The present invention is directed to a novel shielding structure for adjacent conducting traces that overcomes these prior art limitations. Accordingly, it is an object of the present invention to provide a shielding structure that is effective for reducing cross coupling between adjacent conducting traces and increasing capacitive coupling between conducting traces and ground in a semiconductor structure. It is another object of the present invention to provide a shielding structure that is effective for reducing cross coupling between the conducting traces but without using a layout area of the conducting traces.

SUMMARY OF THE INVENTION

In accordance with the present invention a method for forming a novel shielding structure for decoupling conducting traces in a semiconductor structure is provided. The shielding structure, simply stated, includes grounding traces located between adjacent conducting traces for reducing the capacitive coupling (Cc) between the conducting traces and for increasing capacitive coupling to ground (Cg). The grounding traces however, are located on a different layer of the semiconductor structure than the conducting traces (i.e. subjacent) so that a layout area of the conducting traces is not affected. The grounding traces can be connected to a ground source such as a grounded substrate for increasing the capacitive coupling between the conducting traces and the grounded substrate. The shielding structure of the invention can be formed within a monolithic integrated circuit using conventional fabrication processes.

In a preferred embodiment of the invention, the grounding traces are formed of a conductive material such as polysilicon or a metal, and are grounded to the substrate of the semiconductor structure. The grounding traces are embedded in an insulating layer formed on the substrate and are located between and subjacent to the conducting traces to be shielded. This shielding structure places a physical barrier between the conducting traces without affecting the layout area of the conducting traces and at the same time increases the capacitive coupling of the conducting traces to ground.

The shielding structure can be fabricated by a method that includes the steps of:

forming an insulating layer on a substrate;

depositing a grounding layer of a conductive material (i.e. polysilicon or metal) on the insulating layer and connecting the grounding layer to a ground;

patterning and etching the grounding layer to form grounding traces;

depositing an insulating layer over the grounding traces;

depositing a conductive material as a conducting layer over the insulating layer; and patterning and etching the conducting layer to form conducting traces with a grounding trace located between each adjacent pair of conducting traces but on a different layer of the semiconductor structure.

Other objects, advantages, and capabilities of the present invention will become more apparent as the description proceeds.

BRIEF DESCRIPTION OF THE DRAWINGS

FIG. 2A is a schematic diagram of a prior art semiconductor structure for increasing a capacitance to ground for conducting traces by moving a ground plane closer to the conducting traces;

FIG. 2B is a schematic diagram of a prior art semiconductor structure for decreasing a capacitance between conducting traces by providing a shielding trace between the conducting traces;

FIG. 2C is a schematic plan view of FIG. 2B;

FIG. 3A is a schematic diagram of a shielding structure constructed in accordance with the invention for preventing capacitive coupling between adjacent conducting traces of a semiconductor structure; and FIG. 3B is a schematic plan view of FIG. 3A.

DESCRIPTION OF PREFERRED EMBODIMENTS

Figure 1A:
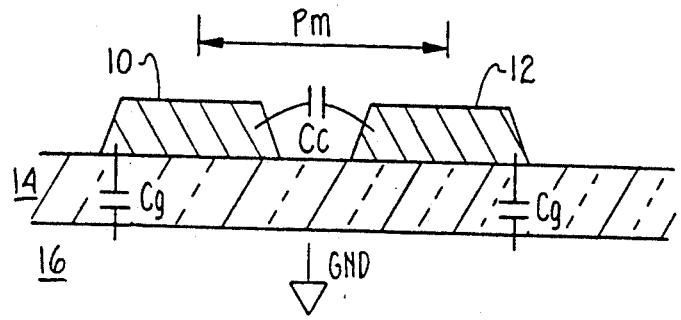
FIG. 1A is a schematic diagram of a prior art semiconductor structure illustrating adjacent conducting traces and cross coupling between the conducting traces and a grounded substrate.
Figure 1B:
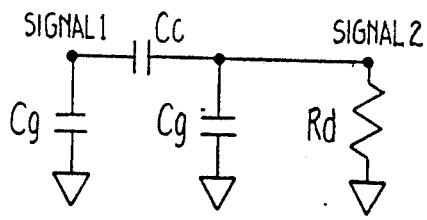
FIG. 1B is an electrical schematic of the structure shown in FIG. 1A.
Figure 1C:
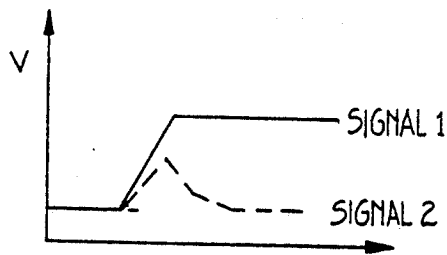
FIG. 1C is a graph of voltage vs time for signals transmitted over the structure of FIG. 1A.

As used herein the terms "trace" and "line" are interchangeable. Additionally, the terms "signal trace" and "conducting trace" are interchangeable. In addition, the term "layer" refers to the vertical location of a structure or film on a semiconductor structure (i.e. subjacent). As an example, a film deposited upon another film would be located on an adjacent layer of the semiconductor structure. As another example a device or line formed upon a film would be located on a different layer of the semiconductor structure. The term "layout area" refers to an IC area occupied by a layer and which is allocated to or can be used for forming semiconductor devices or a structure.

Referring now to FIG. 3A, a shielding structure formed in accordance with the method of the invention is shown and generally designated as 24. The shielding structure 24 simply stated, comprises a plurality of parallel spaced grounding traces 26 formed in an insulating layer 28 on a substrate 30. The grounding traces 26 are between but on a different layer (i.e. vertically) from a plurality of parallel spaced conducting traces 32 formed over the grounding traces 26.

During formation, the grounding traces 26 are electrically connected to a ground source, such as to the substrate 30 which may be grounded. Alternately the grounding traces 26 can be connected to any power supply or source that acts as an AC short to ground.

The grounding traces 26 can be formed of any conductive material such as polysilicon or a metal film. The grounding traces 26 are embedded in the insulating layer 28 and are located in a plane generally parallel to that of the substrate 28 and the conducting traces 32 but on a different layer than the conducting traces 32. The insulating layer 28 may be any dielectric material used in the art such as silicon dioxide ($SiO_2$) or silicon nitride ($SiN_2$).

The conducting traces 32 are formed generally above the grounding traces 26 but on an adjacent layer. The insulating layer 28 separates the conducting traces 32 from the grounding traces 26. The conducting traces 32 can be formed of an electrically conductive material such as aluminum. As clearly shown in FIG. 3A, the conducting traces 26 can be formed generally parallel and spaced from one another at a center to center pitch of Pm. A grounding trace 26 is located in between each pair of adjacent conducting traces 32. In addition, the conducting traces 32 are formed in a plane that is generally above the plane of the grounding traces 26 and on a different layer or vertical level of the semiconductor shielding 24 structure.

With this shielding structure 24, the grounding traces 26 form a physical barrier between adjacent conducting traces 32 and function to diminish cross coupling between adjacent conducting traces 32. This structure thus functions similarly to the prior art structure of FIG. 2B. Since, however, the grounding traces 26 are on a different layer of the semiconductor structure from the conducting traces 32 (i.e. subjacent thereto) the layout area of a semiconductor chip can be conserved and a high circuit density can be maintained. This is illustrated schematically by a comparison of FIG. 2C, a plan view of the prior art structure, with FIG. 3B, a plan view of a shielding structure 24 constructed in accordance with the invention. With the shielding structure 24 of the invention, the conducting traces 32 can be formed on a center to center pitch of Pm, as compared to the prior art structure (FIG. 2B) where a center to center pitch of the conducting lines is 2XPm. A layout area of the conducting traces 32 is thus preserved.

The formation of this layered structure can be aided by the topology of the insulating layer 28 that is formed over the grounding traces 26. The valleys or low areas between the grounding traces 26 form a natural conduit for the location of the conducting traces 32. As an example, this topology could occur after a conformal deposition of the insulating layer 28 over the grounding traces 26.

In FIG. 3A, the capacitance between the conducting traces 32 is designated as (Cc). Even though the conducting traces 32 are physically close to one another, this capacitance (Cc) is relatively low because the grounding traces 26 form a physical barrier between the conducting traces 32. The cross coupling (Cc) between the conducting traces 32 is therefore reduced. In addition the capacitance of the conducting traces 32 to ground is increased by capacitive coupling of the conducting traces 32 to the grounding traces 26, as represented by Cg2. This is due to the close proximity of each conducting trace 32 to two grounding traces 26. Each conducting trace 32 therefor, is coupled to the ground by a capacitance equal to Cg1+Cg2 and capacitive coupling to ground is approximately doubled. In addition, the ratio of Cc (the cross coupling between the conducting traces 32) to Cg (the cross coupling to ground is reduced) i.e. Cc/(Cg1+Cg2) is reduced.

The shielding structure 24 of the invention can be formed by conventional semiconductor fabrication technology. A representative process sequence includes the formation of the grounding traces 26 in the insulating layer 28 followed by formation of the conducting traces 32 over the grounding traces 26. The process sequence may be controlled such that each adjacent pair of conducting traces 32 has a grounding trace 26 in between as a shielding structure. In addition, the grounding traces 26 are formed on a different layer of the semiconductor structure 24 from the conducting traces 32. This geometry is effective for conserving a layout area of a semiconductor chip.

A representative process sequence for the fabrication of the shielding structure 24 of the invention includes the steps of:

1. Depositing an insulating layer 28 (i.e. $SiO_2$) on a substrate 30.
2. Depositing a conducting material (i.e. polysilicon or metal) over the insulating layer 28.
3. Patterning and etching the conducting material to form parallel spaced grounding traces 26 and tying the grounding traces 26 to a ground such as a grounded substrate 30. Alternately, the grounding traces 26 may be connected to any power supply or source that acts as an AC short to ground.
4. Conformally depositing an insulating layer (i.e. $SiO_2$) over the grounding traces 26.
5. Depositing a conducting material as a conducting layer (i.e. aluminum) over the insulating layer.
6. Patterning and etching the conducting layer to form parallel spaced conducting traces 32. The placement of the conducting traces 32 during this patterning step can be controlled such that each conducting trace 32 is physically closer to a pair of grounding traces 26 than to an adjacent conducting trace 32. The close proximity of the conducting traces 32 to the grounding traces 26 capacitively couples the conducting traces 32 to ground rather than to each other. In addition, the grounding traces 26 provide a shielding structure between each adjacent pair of conducting traces 32. Finally the grounding traces 26 are located on a different layer of the semiconducting structure 24 from the conducting traces 32 so that a layout area of the conducting traces 32 is preserved.
6a. With reference to step 6, a natural topography formed by conformal deposition of the insulating layer over the grounding traces 26 can be used to define a natural conduit for formation of the conducting traces 32, with a grounding trace 26 located in between each conducting trace 32 as a shielding structure.

Thus the invention provides a novel method for forming a shielding structure for conductive traces or lines in a semiconductor structure. Although the method of the invention has been described in terms of preferred embodiments, it is intended that other embodiments be covered by the scope and spirit of the following claims.

I claim:

1. A semiconductor fabrication method for forming a shielding structure for conducting traces, comprising:
   forming a first insulating layer on a substrate;
   depositing a grounding layer of a conductive material on the insulating layer;
   patterning and etching the grounding layer to form grounding traces;
   connecting the grounding traces to a ground source;
   depositing a second insulating layer on the grounding traces;
   depositing a conducting layer of a conductive material on the second insulating layer; and
   patterning and etching the conducting layer to form conducting traces with a grounding trace located between each adjacent pair of conducting traces but on a different layer.

2. The method as claimed in claim 1 and wherein:
   the grounding traces are formed of polysilicon.

3. The method as claimed in claim 1 and wherein:
   the grounding traces are formed of metal.

4. The method as claimed in claim 1 and wherein:
   the grounding traces are connected to the substrate that is grounded.

5. The method as claimed in claim 1 and wherein:
   the grounding traces are connected to a power supply that acts as an AC short to ground.

6. The method as claimed in claim 1 and wherein:
   the second insulating layer is conformably deposited over the grounding traces and valleys are formed between the grounding traces and used as a conduit for the conducting traces.

7. The method as claimed in claim 1 and wherein:
   the conducting layer is formed of aluminum.

8. A semiconductor manufacturing method for forming a semiconductor shielding structure having conducting traces on a grounded substrate, comprising:
   depositing an insulating material on the substrate to form a first insulating layer;
   depositing a conducting material over the first insulating layer to form a grounding layer;
   patterning and etching the grounding layer to form grounding traces;
   connecting the grounding traces to the substrate and grounding the substrate;
   conformably depositing an insulating material over the grounding traces such that the grounding traces are embedded in insulating material;
   depositing a conducting material over the insulating material to form a conducting layer; and
   patterning and etching the conducting layer to form conducting traces with each adjacent pair of conducting traces having a grounding trace therebetween but on a subjacent layer;
   whereby each conducting trace is capacitively coupled to the grounded substrate and to a pair of grounding traces for coupling to ground but is physically shielded from adjacent conducting traces to decrease a capacitive coupling between adjacent conducting traces.

9. The method as claimed in claim 8 and wherein:
   the conducting material for the grounding layer is polysilicon.

10. The method as claimed in claim 8 and wherein:
    the conducting material for the grounding layer is metal.

11. The method as claimed in claim 8 and wherein:
    conformed deposition of the insulating material over the grounding traces forms a natural conduit for the conducting traces.

12. The method as claimed in claim 8 and wherein:
    the grounding traces are connected to a power supply that acts as an AC short to ground for the conducting traces.

13. The method as claimed in claim 8 and wherein:
    a distance between a conducting trace and a grounding trace is less than a distance between a conducting trace and the ground such that the conducting traces are capacitively coupled to two adjacent grounding traces and a capacitive coupling to ground is approximately doubled.

* * * * *